United States Patent [19]

Clodgo et al.

[11] Patent Number: 4,723,978
[45] Date of Patent: Feb. 9, 1988

[54] METHOD FOR A PLASMA-TREATED POLYSILOXANE COATING

[75] Inventors: Donna J. Clodgo; Rosemary A. Previti-Kelly, both of Richmond; Erick G. Walton, Johnson, all of Vt.

[73] Assignee: International Business Machines Corporation, Armonk, N.Y.

[21] Appl. No.: 793,390

[22] Filed: Oct. 31, 1985

[51] Int. Cl.$^4$ .............. C03C 17/00; C03C 10/00; B44C 1/22
[52] U.S. Cl. .............. 65/31; 65/33; 65/901; 65/18.1; 156/643; 156/663
[58] Field of Search .............. 65/17, 31, 33, 901, 65/18.1; 156/643, 644, 657, 668, 635, 662, 663; 427/41

[56] References Cited

U.S. PATENT DOCUMENTS

| | | | |
|---|---|---|---|
| 3,321,350 | 5/1967 | Fekete | 156/329 |
| 3,702,783 | 11/1972 | Hartlein | 117/126 |
| 4,173,683 | 11/1979 | Comizzoli | 428/447 |
| 4,209,356 | 6/1980 | Stein | 156/643 |
| 4,222,792 | 9/1980 | Lever et al. | 148/1.5 |
| 4,349,609 | 9/1982 | Takeda et al. | 428/429 |
| 4,430,153 | 2/1984 | Gleason et al. | 156/643 |
| 4,464,460 | 8/1984 | Hiraoka et al. | 156/668 |

OTHER PUBLICATIONS

Arkles, "Tailoring Surfaces with Silanes," *Chemtech*, Dec. 1977, pp. 766–778.
Kitahohji et al, "Thermal Stability of Polyladder Organosiloxane," *Jpn. J. Appl. Phy.*, vol. 22, No. 12, 1983, p. 1934.
Takeda et al, "Ladder-Organosiloxane Polymer as an Insulation Layer," *ECS Ext. Abst.*, vol. 80, No. 2, 1980, pp. 819–820.
Butherus et al, "$O_2$ Plasma—Converted Spin-On-Glass for Planarization," *J. Vac. Sci. Technol. B*, Sep./Oct. 1985, pp. 1352–1356.
Plueddemann, *Silane Coupling Agents* (1st Ed., Plenum Press 1970), pp. 56–57.
Roberts, "The Preparation and Properties of a Polysiloxane Electron Resist," *J. Elec. Soc.: S. State Sci. Tech.*, Dec. 1973, pp. 1716–1721.
Ishida et al, "The Structure of an Aminosilane Coupling Agent in Aqueous Solutions and Partially Cured Solids," *J. Polymer Sci: Polymer Phy. Ed.*, vol. 20, Apr. 1982, pp. 701–718.

*Primary Examiner*—Kenneth Schor
*Assistant Examiner*—Michael K. Boyer
*Attorney, Agent, or Firm*—Jeffrey S. LaBaw; M. F. Chadurjian; M. H. Klitzman

[57] ABSTRACT

By hydrolyzing an organoalkoysilane monomer at high concentration in solution to form a silanol, allowing the silanol to age to produce a low molecular weight oligomer, spin-applying the oligomer onto a substrate to form a discrete film of highly associated cyclic oligomer thereon, heat treating the oligomer film to form a modified ladder-type silsesquioxane condensation polymer, and then oxidizing the silsesquioxane in an $O_2$ RIE, an organoglass is formed which presents novel etch properties. The organoglass can be used as an etch-stop layer in a passivation process.

10 Claims, No Drawings

METHOD FOR A PLASMA-TREATED POLYSILOXANE COATING

TECHNICAL FIELD

The present invention relates to a method of treating a modified silsesquioxane polymer derived from an organoalkoxysilane in an oxygen plasma so as to produce an organoglass having useful etch properties.

BACKGROUND ART

The use of organic insulating layers is well known in the semiconductor processing art. Since organic insulators can be coated on substrates, they produce a degree of planarization not found in other thermally grown or vapor deposited insulating films. Moreover, organic insulating layers present film stresses which are compatible with metals such as aluminum/copper alloys, and thus they can be used to passivate the transistors, etc. formed on a semiconductor substrate.

These organic insulating layers must meet several relatively strict criteria. First, they should have the ability to passivate over topographical obstructions in a manner which results in stable adherent properties through subsequent high thermal exposures (e.g. 300° C.-400° C.). Second, the resulting film should be crack-free over all topographical steps. Third, these mechanically defect-free properties should not degrade through subsequent reliability stress conditioning (involving elevated temperature, humidity, and electrical bias) for more than 1000 hours.

More recently, a particular class of organic materials, referred to as "organosilanes", have been used in semiconductor applications.

In general, the use of organosilanes has been predominantly directed to promoting the adhesion of polyimide layers to underlaying layers. See e.g. U.S. Pat. No. 3,702,873, issued 11/14/72 to Hartlein.

U.S. Pat. No. 4,222,792 (issued 8/15/82 to Lever et al) discloses a method of forming filled isolation trenches utilizing an organosilane (i.e. polysiloxane). The isolation trenches are filled with a polymer consisting of alternating atoms of silicon and oxygen with organic groups attached to the silicon atoms, which is then E-beam exposed and developed. The polymer acts as a negative E-beam resist. The exposed polymer is then converted to $SiO_2$ by heat treatment at 600° C. in an oxygen furnace.

U.S. Pat. No. 4,430,153 (issued 2/7/84 to Gleason et al) discloses the formation of a reactive ion etch (RIE) barrier by coating an aromatic polyamic acid/imide on a silicon substrate, in-situ conversion of the polyamic acid to an alkyl polyamide/imide copolymer by exposure to an alkyl amino silicon compound, and selectively oxidizing portions of the copolymer to form an $SiO_2$ etch barrier by exposure to a reactive ion etch in an oxygen atmosphere.

U.S. Pat. No. 4,349,609 (issued 9/14/82 to Takeda et al, discloses an organosiloxane polymer which is used as a passivation layer designed to provide a hermetic seal as well as a planarizing capability when applied over metal wiring patterns. A silsesquioxane solid is condensed from organosilane monomers that have a broad range of molecular weights (1000–1,000,000, preferably from about 1,500 to about 200,000). Such resulting glass resin solids (e.g. "GR#650" by Owens-Illinois Corp.) are commercially available in polymeric form with a molecular weight distribution of approximately 7000–20,000. Typically, these solids are spin-applied from a non-aqueous organic solvent such as n-butyl acetate.

Due to the relative low cost and adhesion promotion properties of such organosilanes, the inventors have investigated the use of hydrolyzed organoalkoxysilanes as organic insulating layers. This investigation resulted in the invention as described below.

SUMMARY OF THE INVENTION

It is thus an object of the invention to provide an organic insulating material having novel etch properties.

It is another object of the invention to treat an organoalkoxysilane monomer so as to form an organoglass having novel etch properties.

These and other objects of the invention are realized by first hydrolyzing an organoalkoxysilane monomer by mixing at least 1.0 vol. % of the monomer with an aqueous solvent.

The resulting ilanol is then aged, such that a low molecular weight oligomer is formed. The oligomer is applied to the substrate to form a discrete film of highly associated oligomer thereon. The discrete film is then heat treated by exposure to a series of sequential bakes to form a modified silsesquioxane condensation polymer. The silsesquioxane condensation polymer is then treated in an $O_2$ RIE to form the organoglass of the invention.

The resulting organoglass presents novel etch properties which are utilized in providing an etch-stop layer in a passivation process. The organoglass is substantially etch-resistant in $O_2$ and $BCl_3/Cl_2$ RIE's. Moreover, it exhibits an etch initiation period in 25% $CF_4$/75% $O_2$, which increases with increasing oxygen content.

DESCRIPTION OF THE BEST MODE FOR CARRYING OUT THE INVENTION

In the description of the invention to follow, reference will be made in general to a class of materials known as "organoalkoxysilanes" (hereafter abbreviated "OAS"). This is a class of materials having the general formula $R_n$—Si—$(OR')_{4-n}$, where n=1 or 2, R' typically can be $CH_3$, $C_2H_5$, $C_3H_7$, or $C_4H_9$; and R can be any stable aryl or substituted aryl group, or any stable organic chain, such as $(CH_2)_nCH_2X$, where n=0–4 and X=H or an aryl or substituted aryl group or cycloaliphatic groups or, preferably, $NH_2$. Examples of such materials are gamma-aminopropyltriethoxysilane; gamma-aminopropylmethyl-diethoxysilane; beta-(3,4-epoxycyclohexyl)ethyltrimethoxysilane; and beta-aminoethyl-gamma-aminopropyltriethoxysilane. These materials are all commercially available, and are typically used to promote the adhesion of a subsequent polyimide layer such as PMDA-ODA to a surface such as silicon oxide, silicon nitride, or metal oxide.

(A) Initial Hydrolysis

In the invention, the organosilane monomer is first hydrolyzed by exposure to pure deionized water or a solvent having water as its principal impurity, such as ethanol, methanol, or isopropanol. Addition of less than 0.1 vol. % of an organic wetting agent (e.g. a surfactant such as that sold under the tradename "FC-93" by the 3M Corp.) may be required when pure water is the solvent, in order to improve the ability of solution to "wet" the substrate surface. This may be particularly necessary when the solution is applied onto underlaying organic layers or other surfaces which may exhibit significant hydrophobic behavior. Use of non-aqueous solvents that possess hydrophobic functional groups, e.g., use of conventional alcohols ($CH_3OH$, $C_2H_5OH$, etc.) as components of the solvent system, may preclude the necessity for a wetting agent. Typically, the organoalkoxysilane and the water are mixed in a 3:2 to 1:5 volume ratio of organoalkoxysilane:water for at least 30 seconds by vigorous agitation in a non-glass beaker. The mixing parameters are controlled such that the organoalkoxysilane is at least partially hydrolyzed to form the corresponding silanol having the generic formula $R—Si—(OH)_3$ or $R_2—Si—(OH)_2$.

The chemical reactions involved in hydrolyzing organoalkoxysilanes are explored in an article by H. Ishida et al, entitled "The Structure of an Aminosilane Coupling Agent in Aqueous Solutions and Partially Cured Solids", *Journal of Polymer Science: Polymer Physics Edition*, Vol. 20, No. 4, April 1982 pp. 701-718. Organoalkoxysilane monomers may hydrolyze initially to form the corresponding monosilanol. In time, a mixture of partially- an completely-hydrolyzed silanols is expected to form. The following is the sequence of expected hydrolysis reactions for a typical trialkoxysilane:

(1) $R—Si(OR')_3 + H_2O \rightleftharpoons R'OH + R—Si(OR')_2(OH)$ (2) $R—Si(OR'_2)(OH) + H_2O \rightleftharpoons R'OH + R—Si(OR')(OH)_2$ (3) $R—Si(OR'_2)(OH)_2) + H_2O \rightleftharpoons R'OH + R—Si(OH)_3$ or, overall, (4) $R—Si(OR')_3 + 3H_2O \rightleftharpoons R—Si(OH)_3 + 3 R'OH$ In actual practice, mixtures of partially-hydrolyzed products may form; i.e. the products of reactions (1), (2) and (3) may exist in equilibrium. Formation of di- and tri-silanols is required in sufficient concentration before further condensation reactions may occur in solution. Both hydrolysis and subsequent condensation reactions to dimeric, trimeric, and higher-order oligomers is influenced by the type of aqueous solvent used, solvent dilution, solvent acidity or basicity, concentration of R'OH, and presence of contaminants (e.g. $F^-$).

Organoalkoxysilanes should react with water provided that the steric hindrance associated with R or R' is not so great as to exclude water from the reactive site for silane hydrolysis. At the same time, the steric hindrance should also be great enough to reduce subsequent silanol condensation sufficiently such that the silanol solution exhibits stability over reasonable time periods at room temperature. The steric hindrance associated with the R-group bonded to silicon is also critical in promoting "cyclic" oligomerization, a mechanistic pathway which favors "closed" intermediates, e.g. cage structures, instead of "open" chains of unlimited length. If the particular choice of alkoxysilane is such that its degree of oligomerization is too high, it may not be possible to limit the reaction and thus subsequent formation of relatively high molecular weight oligomers (e.g. greater than 5000 g/mole) may occur. In the invention, the molecular weight of the oligomer should be in a range up to approximately 4000 g/mole after aging (described below). Such unlimited polycondensation to the high molecular weight oligomer may result in solution instability and unfavorable characteristics for applications as proposed in the present invention; e.g., inhomogeneous film thickness, particulate contamination, etc. Formation of such high molecular weight oligomers in solution is usually evidenced by the occurrence of a degree of haziness in the solution as the reaction proceeds. Therefore, the choice of a suitable organoalkoxysilane according to above-noted constraints results in the formation of partially—or completely-hydrolyzed OAS-species under reasonable conditions of solution stability.

Since the invention requires formation of discrete thin films of condensed alkoxysilanol polymer, it is necessary to achieve relatively high concentrations of dialkoxysilanol and/or trialkoxysilanol in solution so that the subsequent condensation reaction(s) may occur. Post-hydrolysis solution condensation of trialkoxysilanols is known to proceed via an intramolecular cyclization mechanism as noted previously and to result in cyclic "cage" structures based on tetrameric and octameric silanol structures. The concentration of hydrolyzed species determines the degree of intermolecular association and, therefore, the tendency to produce oligomers in solution. Thus a critical parameter of the present process is the volume concentration of the organoalkoxysilane in water. In the absence of limited oligomer formation in solution, it is unlikely that thin films having a thickness in excess of a few molecular layers is possible. For example, absorption of a variety of hydrolyzed organoalkoxysilanes onto glass substrates has been shown to be limited to less than eight molecular layers when the silane is present at 0.25% (vol:vol) in water (B. Arkles, *Chemtech*, 766 (1977)). Films of this thickness may serve as adhesion promoters between different substrates; however, the silane layer or "interphase" may be subject to high mechanical film stresses due to its position between dissimilar substrates. Since such monolayer or "near-monolayer" interphases are not as likely to be extensively cross-linked, their ability to maintain good adhesive properties may degrade with thermal stress. Such behavior is well known for certain highly diluted alkoxysilanes (e.g. 0.1% by volume in water). In general, in order to produce films of the thickness normally required in microelectronics device applications (i.e. in the order of greater than or equal to 250 Å), a minimum of 50-100 molecular "layers" or monolayers would be needed. This is well in excess of the monolayer thickness (10-25 Å) normally obtained when producing layers designed to promote interfacial adhesion between dissimilar substrate layers. The film of the invention is expected to require a minimum concentration of hydrolyzed organo-dialkoxysilane or organo-trialkoxysilane of about 1.0% in the aqueous solution (vol:vol).

As shown by the above discussion, the ability to produce stable solutions of highly associated monomeric, dimeric, and possibly more highly-condensed oligomeric species prior to substrate application is of critical importance in the invention. The invention specifies materials and processing procedures which allow formation of the solution in the presence of a significant concentration of water; in fact, water is a preferred solvent in many potential applications. In general, stabilized intermediate silanols in non-aqueous solvents would not yield acceptable properties (see e.g. K. Andrianov et al, *J. Organomet. Chem.*, V.8, p. 435 (1967), cited in E. Plueddemann, *Silane Coupling Agents*, Plenum Press, N.Y., 1982, p. 56). This is partly because non-aqueous solvents limit the attainable thickness of the resultant silane layer. For example, in Plueddemann a non-aqueous solution of alkylchlorosilane hydrosylate intermediates is described. The presence of additional water in such systems, as would naturally occur in standard application, would catalyze uncontrolled condensate formation and would thereby destabilize such a potential system for use as intended in the context of the present invention.

(B) Aging

After the solvent and the organoalkoxysilane are initially mixed together, the solution is set aside (i.e. "aged") for a period ranging from several hours to several days. This allows the requisite hydrolysis and post-hydrolysis reactions to attain an equilibrium condition. The choice of starting organoalkoxysilane largely determines the specific solution aging period. The main purpose of the aging period is to allow the organoalkoxysilane-solvent mixture to condense to form oligomeric organoalkoxysilanol species of low molecular weight (e.g. in the order of up to 4000 g/mole).

It is emphasized that the aging period is necessary to form the homogeneous, defect-free, thin films of silsesquioxane polymer described below. Failure to allow sufficient solution aging to occur results in films lacking suitable properties, such as freedom from particulates and suitable wetting characteristics. In addition, the physical and electrical properties of the thin films formed therefrom may not possess those properties expected of thin passivation films for microelectronics applications. Although the observation of a clear solution prior to aging may indicate that the reaction has proceeded sufficiently, the inventors have found that in practice consistent results were only achieved by exposing the solution to an aging period.

The specific length of the aging period depends upon the concentration of organoalkoxysilane, the solvent used, the water concentration in the solvent, temperature, chemical composition of aging solution (e.g. solvent acidity or basicity or presence of contaminants or presence of any other deliberately introduced substances), etc. In general, the inventors have found that an aging period ranging between several hours and several days, most preferably between 12 and 48 hours, will produce acceptable film properties.

(C) Application Onto the Substrate

It has been found that the properties of the thin films consisting of at least 50–100 molecular layers produced from the stable, homogenous solutions of organoalkoxysilanols described above are also a function of the in situ polycondensation of the invention (as opposed to a simple absorption processes, such as might be expected to produce only a few monolayers or a single monolayer of silanol on a substrate). Polycondensation reactions are expected to result when conditions favor three-dimensional polymer formation. In the present invention, such highly-ordered solutions undergo in situ polycondensation of low molecular weight silanol oligomeric species on the substrate itself, the preferred method being by spin-application as conventionally practiced in the microelectronics device processing industry. Presumably, the effect which catalyzes the onset of polycondensation is the removal of excess solvent by mechanical means during the application process itself. Such reactions promote formation of relatively stable, highly-associated "cyclic" oligomers, which associate through formation of cyclic intermediates, as opposed to the relatively unstable highly-associated oligomers which form as the result of straight-chain (open) condensation. Such unstable, highly associated siloxane polymers are generally insoluble in water (e.g. silicone polymers) and are thus undesirable in the present invention.

When the solution is spin-coated onto the wafer, the spin speed is typically 2000–5000 RPM. Spin speed is controlled as a function of the desired thickness of the coating, which in all cases is greater than the monolayer thickness as discussed previously. Typically, the resulting coating is approximately 500–15000 Å thick. Alternatively, the solution could be applied by dipping the wafer in a batch of the solution.

(D) Sequential Bake Process

After spin application, the solution is exposed to a series of heat ("bake") treatments at atmospheric pressure. The bake sequence is used to convert the highly associated oligomer to a polysiloxane condensation polymer. Specifically, the bake sequence promotes a cross-linkage reaction to form a ladder-type polymer film.

Conventionally, condensed polysiloxanes are synthesized from di- or trifunctional organosilanes in an "ex situ" manner; i.e., they are polymerized from the mixture of starting material and solvent, and then are washed, dried, and redissolved in a non-aqueous solvent for subsequent application to a substrate of interest. The condensed polymer typically contains oxygen and silicon in a 3:2 proportion. These products are known to contain siloxane linkages. Condensed organotrialkoxysilanols are expected to form silsesquioxanes ($SiO_{1.5}$) so that a "ladder structure" is formed. See e.g. the aforementioned U.S. Pat. No. 4,349,609 to Takeda.

In the invention, the ladder-type silsesquioxane is formed in situ, rather than being completely reacted prior to application to the substrate in question. In the present process the molecular weight of the silsesquioxane is effectively unlimited. In general, a semi-infinite polymer may result, or at least a polymer having a higher average molecular weight than would otherwise be possible. The use of the aforementioned precondensed polymers of similar molecular weights would result in abnormally high solution viscosity and/or an inability to form films having suitable properties.

Silsesquioxane polymers formed by in situ polymerization and baked at approximately 105° C. to remove excess water and solvent would be expected to exhibit idealized O:Si gram-atom ratios; e.g., 3:2. It appears that further baking at higher temperatures, as done in the invention, causes modification of the idealized stoichiometry. Chemical and physical properties of the silsesquioxane film may be significantly altered by the subsequent bakes and bake ambients. It would appear that etch rates, film refractive index, and film density may all be modified by the post-105° C. bake sequence.

For example, a 2000 Å film derived from a 25% (vol:vol) solution of gamma-aminopropyltriethoxysilane in water was formed by spin-application and baked through 160° C. and 200° C. bakes, on a hot-plate in air. The film was then baked through 350° C. in an oven containing $N_2$ and less than 0.1% $O_2$. Depth-profiles of the film were obtained using Auger spectroscopy. The film was homogeneous, but exhibited a modified silsesquioxane structure as shown below:

| Elemental Ratio | Gram Atomic Ratio (theoretical) | Gram Atomic Ratio (processed film) |
| --- | --- | --- |
| $\dfrac{O}{Si}$ | $\dfrac{1.5}{1}$ | $\dfrac{1.9}{1}$ |
| $\dfrac{C}{Si}$ | $\dfrac{3.0}{1}$ | $\dfrac{0.8}{1}$ |

| Elemental Ratio | Gram Atomic Ratio (theoretical) | Gram Atomic Ratio (processed film) |
|---|---|---|
| $\frac{N}{Si}$ | $\frac{1.0}{1}$ | $\frac{0.1}{1}$ |

This analysis implies that (neglecting H) the empirical formula of the modified silsesquioxane of the present invention is $[Si_{10}O_{19}C_8N]$. This is to be compared with the theoretical empirical formula for the idealized silsesquioxane $[Si_2O_3C_6N_2]$. In other words, by using the sequential bake process of the invention, the ideal silsesquioxane structure has undergone modification to a polymer with an empirical formulation approaching that of $SiO_2$.

However, it would appear that the ladder polymer structure is essentially retained. The overall polymer is significantly different in structure from that of vitreous silica or crystalline silica (quartz), wherein the framework may be regarded as an infinite assembly of $SiO_4$ tetrahedra sharing vertices in a random, three-dimensional network. For the film thickness range of interest, the inventors have found that a series of bakes at 160° C., 200° C. and 350° C., each carried out for approximately 20–60 minutes, is sufficient to promote the formation of the above-described, modified, ladder-type silsesquioxane.

(E) $O_2$ Plasma Treatment

The resulting modified silsesquioxane is then treated in an $O_2$ plasma. This treatment causes depletion of some of the R groups by oxygen atoms (i.e. the ladder polymer undergoes oxidative transformation). The resulting material is an "organoglass", in that there is some $-CH_2$ and $-CH_3$ or other organic component remaining which substantially alters the etch properties of the resulting film (as will be described in detail below). The oxygen plasma exposure is controlled such that the required amount of oxidative transformation is acheived in as short a time as possible. The oxidation process, when applied particularly in a reactive ion etch (RIE) mode so as to impart significant anisotropic characteristics to the plasma/surface interaction, is expected to convert the outermost portion of the film to a more highly oxidized state. Auger analysis of the post-RIE film shows that a distinct surface layer of approximate 500 Å thickness was formed, whereas the remainder of the film (i.e. the bulk film) was homogeneous with respect to Si, O C, and N content and exhibited only slightly reduced carbon content as compared to the pre-RIE film. Specifically, the 500 Å surface layer had an empirical formulation of $[Si_5O_{12}]$. The bulk film had an empirical formulation of $Si_{10}O_{20}C_5N]$, disregarding H content, which is closely analogous to the empirical formulation for the pre-RIE treated, modified, silsesquioxane film.

These results clearly demonstrate that RIE treatment in oxygen converts a significant portion of the modified silsesquioxane polymer to an inorganic oxide whose oxygen:silicon ratio is at least equivalent to or greater than that found in quartz or vitreous silica. The remainder of the film exhibits an "organic" (C+N) content of approximately 15 atomic percent. The inventors have found that exposure in an RF (radio frequency) oxygen plasma under moderate conditions of power (in the order of 500 watts) and pressure (in the order of $(125 \times 10^{-6}$ Torr) for a time ranging from 5 to 30 minutes is sufficient to produce these results. Such reactive-ion-etch conditions are accompanied by base sputtering rates capable of removing a maximum of about 3000 Å of siloxane polymer.

In general, the resulting organoglass presents a variety of useful etch properties. It is substantially etch resistant in plasma or reactive ion etches in oxygen or boron trichloride/chlorine atmospheres. Also, in a carbon tetraflouride/oxygen atmosphere, the organoglass displays an "initiation period" (i.e. a delay between the time the film is exposed to the etchant and the time the film begins to etch) which can be controlled by varying the $CF_4$ concentration between approximately 1% and 25% volume in $O_2$.

As such, the organoglass is useful in a wide variety of semiconductor processing applications. Such a film could be useful as a passivation layer in low-temperature technologies. Also, the film could be used as an etch-stop layer disposed on an underlaying passivation layer (e.g. polyimide) which would be etched during definition of an overlaying polyimide layer. In short, the film presents the advantageous (i.e. planarization) properties of organic insulators such as polyimide, without having the adhesion problems, etch removal difficulties, or relatively high costs associated with conventional polyimides. In addition, the inventors have found that the organoglass produces minimum film stresses when applied to metals (e.g. aluminum-copper-silicon), polyimide, and other materials used in semiconductor fabrication. This holds true for an organoglass layer of any thickness. By comparison, if one were to use a chemically-vapor-deposited (CVD) glass or a spin-applied non-aqueous solution of preformed (i.e. previously precipitated) siloxane at a thickness greater than 1000 Å film stresses would be produced which would result in film cracking after heat treatment.

Specific examples of the above process will now be described in detail below.

EXAMPLE 1

A 1.0 liter batch of 3-aminopropyltriethoxysilane solution was prepared by adding 250 ml of the neat monomer (supplied by the Union Carbide Corp. under the tradename "A1100") to 750 ml of deionized $H_2O$. The constituents were mixed for 0.5 minutes in a non-glass beaker at atmospheric pressure and room temperature. The solution was allowed to age under static condition of rest at room temperature for approximately 24 hours to form the low molecular weight oligomer.

The resulting oligomer solution was then applied to a 100 mm (diameter) wafer by spin-application of 8 ml at 3000 RPM for 25 seconds. The resulting highly associated oligomer film was 4000 Å thick.

After spin application, the oligomer was converted to the modified silsesquioxane polymer by heat treatment on a hotplate for 20 minutes at 100° C., 20 minutes at 160° C., 25 minutes at 200° C., and then for 30 minutes at 350° C., all at atmospheric pressure. The 350° C. bake was carried out in a $N_2$ atmosphere having less than 0.1% $O_2$.

The modified silsesquioxane was then treated for 5.0 minutes in a 100% $O_2$ RIE plasma at $125 \times 10^{-6}$ Torr and 500 Watts, to form the organoglass of the invention.

EXAMPLE 2

A 1.0 liter batch of beta-aminoethyl-gamma-aminopropyltrimethoxysilane solution was prepared by adding 250 ml of the neat monomer (supplied by the Dow-Corning Corp. under the tradename "Z-6020") to 750 ml of deionized $H_2O$. The constituents were mixed for 0.5 minutes in a non-glass beaker at atmospheric pressure and room temperature. The solution was allowed to age under static condition of rest at room temperature for 24 hours to form the low molecular weight oligomer.

The resulting oligomer in solution was then applied to a 100 mm wafer by spin-application of 10 ml liters of the oligomer at 5000 RPM for 25 seconds. The resulting highly-associated oligomer film was 4000 Å thick.

After spin application, the oligomer was then converted to a modified ladder-type silsequioxane polymer by heat treatment on a hotplate for 20 minutes at 100° C., 20 minutes at 160° C., 25 minutes at 200° C., and then for 30 minutes at 350° C., all at atmospheric pressure. The 350° C. bake was carried out in an $N_2$ atmosphere having less than 0.1% $O_2$.

The modified silsequioxane was then treated for 5 minutes in a 100% $O_2$ plasma at $125 \times 10^{-6}$ Torr and 500 Watts, to form the organoglass of the invention.

EXAMPLE 3

A 1.0 liter batch of beta-(3,4-epoxycyclolexyl)ethyl-trimethoxysilane solution was prepared by adding 25.0 ml of the neat monomer (supplied by the Union Carbide Corp. under the tradename "A186") to 75.0 ml of deionized $H_2O$. The constituents were mixed for 1.0 minute in a non-glass beaker at atmospheric pressure and room temperature. The solution was allowed to age under static condition of rest at room temperature for 12 hours to form the low molecular weight oligomer.

The resulting oligomer solution was then applied to a wafer by spin-application of 5 ml at 3000 RPM for 25 seconds. The resulting highly-associated oligomer film was 1000 Å thick.

After spin application, the oligomer was then converted to the modified silsesquioxane polymer by heat treatment on a hotplate for 20 minutes at 100° C., 20 minutes at 160° C., 25 minutes at 200° C., and then for 30 minutes at 350° C., all at atmospheric pressure. The 350° C. bake was carried out in an $N_2$ atmosphere having less than 0.1% $O_2$.

The modified silsesquioxane was then treated for 10 minutes in a 100% $O_2$ plasma at $125 \times 10^{-6}$ Torr and 500 Watts to form the organoglass of the invention.

Subsequent studies performed on the organoglass confirm that it is substantially etch resistant in $O_2$ and $BCl_3/Cl_2$ reactive ion etches (RIE). The studies found that in a 25% $CF_4$/75% $O_2$ RIE, the film exhibited an etch initiation period of approximately one minute; and at 10% $CF_4$/90% $O_2$, the film exhibited an etch initiation period of approximately ten minutes. In general, the initiation period appears to increase as the oxygen content of a $CF_4/O_2$ RIE atmosphere is increased above approximately 75%, until at 100% $O_2$, the material is substantially etch resistant. Silicone polyimides and standard polyimides may exhibit optimized etch rates in $CF_4/O_2$ plasmas having the above composition.

Films as processed above have been used as etch barriers for reactive ion etching of polyimide/metal layers. As part of a passivation/metallization process, a layer of PMDA-ODA polyimide is applied to a processed semiconductor wafer and is patterned by etching in an $O_2$ RIE through a photoresist mask. A layer of aluminum-copper metallurgy is then applied so that it at least partially fills the openings in the polyimide layer, and then the photoresist is stripped in n-methyl pyrrolidone to lift-off undesired portions of the metal. The organoglass is then applied over the wiring pattern and the polyimide. Another layer of polyimide is subsequently applied to the composite structure. When the overlaying polyimide is etched in an $O_2$ RIE, the organoglass will protect the underlaying polymide from being etched. As previously mentioned, the organoglass does not produce harmful film stresses which would degrade the properties of the underlaying films.

It is to be understood that while modifications to the above teachings may be made by the worker of skill in the art, such modifications fall within the purview of the present invention as described herein and claimed below.

We claim:

1. A method of forming an organoglass insulating layer, comprising the steps of:
    combining an organoalkoxysilane monomer with an aqueous solvent to form a silanol solution having greater than approximately 1.0 vol. % of organoalkoxysilane;
    subjecting said silanol to an aging period of at least several hours to promote molecular association and convert said silanol to a low molecular weight oligomer in solution;
    applying said low molecular weight oligomer to a substrate to form a discrete layer of highly associated cyclic oligomer thereon wherein said discrete layer of highly associated cyclic oligomer undergoes insitu poly condensation;
    heat treating said substrate to cause at least partial oxidative transformation of said cyclic oligomer film to produce a modified ladder-type silsesquioxane polymer and;
    treating said modified ladder-type silsesquioxane polymer in an oxygen plasma to form an organoglass.

2. The method as recited in claim 1, wherein said organoalkoysilane is selected from the group consisting of gamma-aminopropyltriethoxysilane, gamma-aminopropylmethyldiethoxysilane, beta-(3,4 epoxycyclohexyl) ethyltrimethoxysilane, and beta-aminoethylgamma-aminopropyltriethoxysilane.

3. The method as recited in claim 2, wherein said organoalkoxysilane comprises gamma-aminopropyltriethoxysilane.

4. The method of claim 1, wherein said solvent is selected from the group consisting of ethanol, methanol, isopropanol and deionized water.

5. The method as recited in claim 3, wherein said organoalkoxysilane is mixed with deionized water in a volume ratio of 1:3 of organoalkoxysilane:water.

6. The method as recited in claim 5, wherein said silanol is heat treated by sequential bake cycles at 160° C., 200° C., 250° C. and 350° C.

7. The method as recited in claim 6, wherein said oxygen plasma treatment step is carried out for 5 minutes in a $O_2$ RIE reactor at 500 Watts and $125 \times 10^{-6}$ Torr.

8. A method of forming an organoglass insulating layer on a substrate, comprising the steps of
    substantially hydrolyzing gamma-aminopropyltriethoxysilane monomer to form a silanol having a concentration of at least 25% of the monomer in solution;
    subjecting said silanol to an aging period of approximately 24 hours to promote intermolecular association and convert said silanol to a low molecular weight oligomer in solution;

spin-applying said low molecular weight oligomer onto a substrate to form a discrete layer of highly-associated cyclic oligomer having a thickness greater than approximately 250 Å thereon;

sequentially baking said discrete layer of highly-associated cyclic oligomer to form a modified ladder-type silsesquioxane condensation polymer; and exposing said silsesquioxane to a reactive ion etch in an oxygen atmosphere, the resulting organoglass being substantially etch resistant in reactive ion etches carried out in a 100% $O_2$ atmosphere, and exhibiting an etch initiation period in reactive ion etches carried out in atmosphere of 25% $CF_4$/75% $O_2$, said etch initiation period increasing with increased $O_2$ content above 75%.

9. The method as recited in claim 1 wherein said organoglass has a oxygen:silicon ratio at least equivalent to that of quartz.

10. The method as recited in claim 1 wherein the molecular weight of said oligomer is in a range up to approximately 4000 g/mole after aging.

* * * * *